(12) United States Patent
Chen et al.

(10) Patent No.: US 12,031,705 B2
(45) Date of Patent: Jul. 9, 2024

(54) LIGHTING APPARATUS

(71) Applicant: XIAMEN LEEDARSON LIGHTING CO., LTD, Fujian (CN)

(72) Inventors: Jinyao Chen, Fujian (CN); Xiaoliang Wen, Fujian (CN); Yongzhe Dong, Fujian (CN); Shouqiang Hou, Fujian (CN)

(73) Assignee: XIAMEN LEEDARSON LIGHTING CO., LTD, Fujian (CN)

( * ) Notice: Subject to any disclaimer, the term of this patent is extended or adjusted under 35 U.S.C. 154(b) by 0 days.

(21) Appl. No.: 17/378,572

(22) Filed: Jul. 16, 2021

(65) Prior Publication Data

US 2022/0018528 A1 Jan. 20, 2022

(30) Foreign Application Priority Data

Jul. 16, 2020 (CN) .......................... 202021400703.0

(51) Int. Cl.
*H05K 5/02* (2006.01)
*F21V 17/10* (2006.01)
*F21V 23/00* (2015.01)
*F21V 23/04* (2006.01)

(52) U.S. Cl.
CPC ............ *F21V 23/007* (2013.01); *F21V 17/10* (2013.01); *F21V 23/002* (2013.01); *F21V 23/04* (2013.01); *H05K 5/0204* (2013.01)

(58) Field of Classification Search
CPC ... H05K 5/0204; F21V 23/007; F21V 23/002; F21V 23/04; F21V 17/10
See application file for complete search history.

(56) References Cited

U.S. PATENT DOCUMENTS

| | | | | |
|---|---|---|---|---|
| 5,545,862 A * | 8/1996 | Takano | ................... | H01H 15/04 200/16 R |
| 6,841,744 B1 * | 1/2005 | Kodo | ..................... | H01H 13/52 200/16 D |
| 10,462,871 B2 * | 10/2019 | Van Winkle | ............ | F21V 15/01 |
| 10,655,827 B2 * | 5/2020 | Buck | ..................... | F21V 23/001 |
| 10,914,459 B2 * | 2/2021 | Yang | ..................... | F21V 23/008 |
| 11,002,432 B2 * | 5/2021 | Chen | ..................... | F21V 23/003 |
| 11,162,671 B2 * | 11/2021 | Luo | ......................... | F21V 23/008 |
| 11,193,638 B2 * | 12/2021 | Luo | ......................... | H05B 47/10 |
| 11,255,498 B2 * | 2/2022 | Van Winkle | .......... | F21V 21/044 |
| 2012/0043189 A1 * | 2/2012 | Kodama | ............. | H01H 15/005 200/329 |

(Continued)

*Primary Examiner* — Abhishek M Rathod
(74) *Attorney, Agent, or Firm* — Chun-Ming Shih; LANWAY IPR SERVICES

(57) ABSTRACT

A lighting apparatus includes a fixing bracket, a driver plate, a driver circuit, a driver container, a manual switch, a shielding cover, a cover plate and a light source. The fixing bracket has a first wall, a second wall and a third wall. The first wall and the third wall are connected on two sides of the second wall. The first wall has a door opening. The driver circuit is mounted on the driver plate. The driver container is fixed to the fixing bracket. The driver container has a driver opening facing to the first wall. The manual switch disposed on the driver plate. The manual switch has a switch pin to be moved for selecting a setting of the driver circuit. The shielding cover conceals the manual switch so that users do not touch the manual switch directly from outside of the lighting apparatus.

13 Claims, 9 Drawing Sheets

(56) References Cited

U.S. PATENT DOCUMENTS

| | | | |
|---|---|---|---|
| 2013/0231007 A1* | 9/2013 | Iwamoto | H01H 15/16 439/620.21 |
| 2015/0233537 A1* | 8/2015 | Athalye | H05B 45/3725 362/147 |
| 2018/0206305 A1* | 7/2018 | Van Winkle | F21S 8/026 |
| 2019/0037663 A1* | 1/2019 | Van Winkle | F21S 8/026 |
| 2019/0106938 A1* | 4/2019 | Foley | E06B 9/581 |
| 2019/0242561 A1* | 8/2019 | Abrina | F21V 19/02 |
| 2019/0254139 A1* | 8/2019 | Van Winkle | F21V 19/002 |
| 2020/0181408 A1* | 6/2020 | Beyer | A61L 28/0015 |
| 2020/0191344 A1* | 6/2020 | Van Winkle | F21V 5/04 |
| 2020/0224857 A1* | 7/2020 | Liang | F21V 14/06 |
| 2020/0271281 A1* | 8/2020 | Huang | F21S 8/026 |
| 2020/0370737 A1* | 11/2020 | Yang | F21S 8/026 |
| 2020/0400297 A1* | 12/2020 | Hou | F21V 15/012 |
| 2021/0054979 A1* | 2/2021 | Van Winkle | G02B 6/005 |
| 2021/0080088 A1* | 3/2021 | Chen | F21V 21/005 |
| 2021/0131627 A1* | 5/2021 | Luo | F21S 8/04 |
| 2021/0131653 A1* | 5/2021 | Luo | F21V 23/008 |

* cited by examiner

LIGHTING APPARATUS

FIELD

The present invention is related to a lighting apparatus, and more particularly related to a lighting apparatus with an external driver.

BACKGROUND

The time when the darkness is being lighten up by the light, human have noticed the need of lighting up this planet. Light has become one of the necessities we live with through the day and the night. During the darkness after sunset, there is no natural light, and human have been finding ways to light up the darkness with artificial light. From a torch, candles to the light we have nowadays, the use of light have been changed through decades and the development of lighting continues on.

Early human found the control of fire which is a turning point of the human history. Fire provides light to bright up the darkness that have allowed human activities to continue into the darker and colder hour of the hour after sunset. Fire gives human beings the first form of light and heat to cook food, make tools, have heat to live through cold winter and lighting to see in the dark.

Lighting is now not to be limited just for providing the light we need, but it is also for setting up the mood and atmosphere being created for an area. Proper lighting for an area needs a good combination of daylight conditions and artificial lights. There are many ways to improve lighting in a better cost and energy saving. LED lighting, a solid-state lamp that uses light-emitting diodes as the source of light, is a solution when it comes to energy-efficient lighting. LED lighting provides lower cost, energy saving and longer life span.

The major use of the light emitting diodes is for illumination. The light emitting diodes is recently used in light bulb, light strip or light tube for a longer lifetime and a lower energy consumption of the light. The light emitting diodes shows a new type of illumination which brings more convenience to our lives. Nowadays, light emitting diode light may be often seen in the market with various forms and affordable prices.

After the invention of LEDs, the neon indicator and incandescent lamps are gradually replaced. However, the cost of initial commercial LEDs was extremely high, making them rare to be applied for practical use. Also, LEDs only illuminated red light at early stage. The brightness of the light only could be used as indicator for it was too dark to illuminate an area. Unlike modern LEDs which are bound in transparent plastic cases, LEDs in early stage were packed in metal cases.

In 1878, Thomas Edison tried to make a usable light bulb after experimenting different materials. In November 1879, Edison filed a patent for an electric lamp with a carbon filament and keep testing to find the perfect filament for his light bulb. The highest melting point of any chemical element, tungsten, was known by Edison to be an excellent material for light bulb filaments, but the machinery needed to produce super-fine tungsten wire was not available in the late 19th century. Tungsten is still the primary material used in incandescent bulb filaments today.

Early candles were made in China in about 200 BC from whale fat and rice paper wick. They were made from other materials through time, like tallow, spermaceti, colza oil and beeswax until the discovery of paraffin wax which made production of candles cheap and affordable to everyone. Wick was also improved over time that made from paper, cotton, hemp and flax with different times and ways of burning. Although not a major light source now, candles are still here as decorative items and a light source in emergency situations. They are used for celebrations such as birthdays, religious rituals, for making atmosphere and as a decor.

Illumination has been improved throughout the times. Even now, the lighting device we used today are still being improved. From the illumination of the sun to the time when human can control fire for providing illumination which changed human history, we have been improving the lighting source for a better efficiency and sense. From the invention of candle, gas lamp, electric carbon arc lamp, kerosene lamp, light bulb, fluorescent lamp to LED lamp, the improvement of illumination shows the necessity of light in human lives.

There are various types of lighting apparatuses. When cost and light efficiency of LED have shown great effect compared with traditional lighting devices, people look for even better light output. It is important to recognize factors that can bring more satisfaction and light quality and flexibility.

It is important to provide a light device with flexible functions. That is, users may easily change a setting of the light device.

However, when the setting is performed via a switch exposed outside, there is certain safety concern.

Therefore, it is important to design a safe design while maintaining low cost.

SUMMARY

In some embodiments, a lighting apparatus includes a fixing bracket, a driver plate, a driver circuit, a driver container, a manual switch, a shielding cover, a cover plate and a light source.

The fixing bracket has a first wall, a second wall and a third wall.

The first wall and the third wall are connected on two sides of the second wall.

The first wall has a door opening.

The driver circuit is mounted on the driver plate.

The driver container contains the driver plate.

The driver container is fixed to the fixing bracket.

The driver container has a driver opening facing to the first wall.

The manual switch disposed on the driver plate.

The manual switch has a switch pin to be moved for selecting a setting of the driver circuit.

The shielding cover conceals the manual switch so that users do not touch the manual switch directly from outside of the lighting apparatus.

The cover plate has a sliding hole for the shielding cover to move along the sliding hole.

The cover plate is fixed on the door opening.

The light source receives a driving current generated by the driver circuit.

In some embodiments, the driver container is fixed inside a driver housing, the driver housing is fixed to the fixing bracket.

In some embodiments, the lighting apparatus may also include a side cover.

The driver container and the driver housing have a side opening aside the third wall, and the side cover closes the side opening.

In some embodiments, the lighting apparatus may also include a wire plate for attaching a power wire to transmit an external power to the driver circuit to generate the driving current.

In some embodiments, the driver plate has two limiting layer for fixing the power wire to prevent undesired movement of the power wire.

In some embodiments, the wire plate is fixed to the door opening.

In some embodiments, the cover plate is attached on the wire plate.

In some embodiments, a mixed signal wire is used to connecting both the manual switch and the power wire to the driver circuit.

In some embodiments, the shielding cover is electric insulating

In some embodiments, the cover plate is electric insulating.

In some embodiments, the shielding cover has an elastic surface.

In some embodiments, the cover plate is replaceble to correspond a type of the setting.

In some embodiments, the lighting apparatus may also include a first fixing plate and a second fixing plate.

The first fixing plate is extended and perpendicular to the first wall.

The second fixing plate is extended and perpendicular to the third wall.

The first fixing plate and the second fixing plate are used for fixing the lighting apparatus to a platform.

In some embodiments, the driver plate is disposed on the driver container with a top gap and a bottom gap to inner surfaces of the driver container.

In some embodiments, the second wall has a wire hole covered with a detachable wire cover.

In some embodiments, a fuse is placed between the driver circuit and and the manual switch.

In some embodiments, the manual switch has a switch body mounted on the driver plate.

In some embodiments, there is an air gap between the shielding cover and the switch pin.

In some embodiments, a socket is formed inside the shielding cover for plugging the switch pin.

In some embodiments, the cover plate has a sliding track for moving the shielding cover.

DETAILED DESCRIPTION

Figure 8:
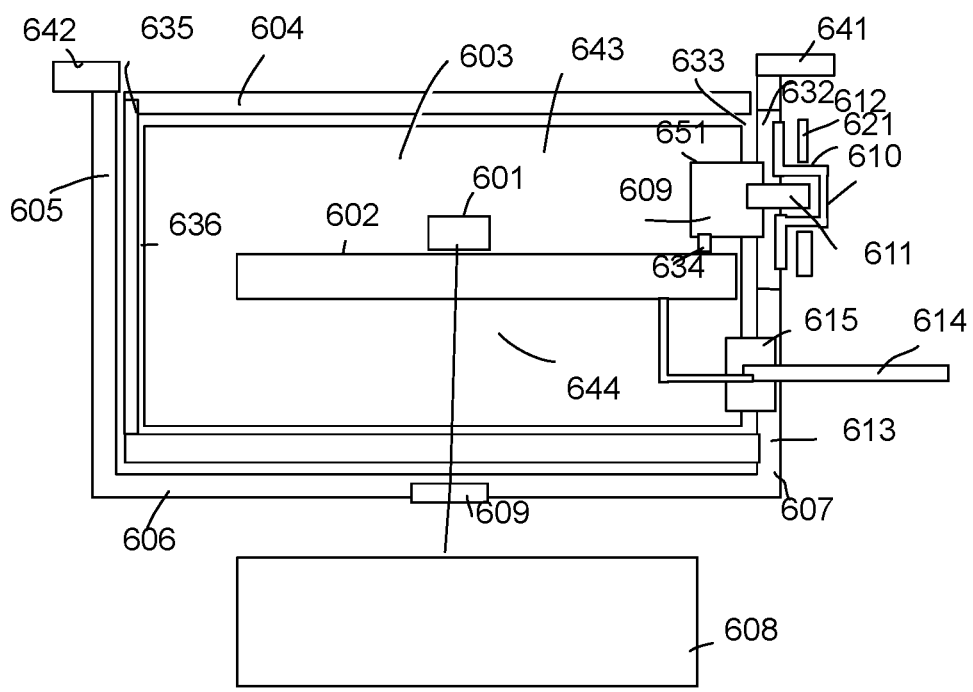
FIG. 8 illustrates an embodiment of a lighting apparatus.

FIG. 8 shows a lighting apparatus embodiment. In FIG. 8, a lighting apparatus includes a fixing bracket 613, a driver plate 602, a driver circuit 601, a driver container 603, a manual switch 609, a shielding cover 610, a cover plate 612 and a light source 608.

The fixing bracket 613 has a first wall 607, a second wall 606 and a third wall 605.

The first wall 607 and the third wall 605 are connected on two sides of the second wall 606.

The first wall 607 has a door opening 632.

The driver circuit 601 is mounted on the driver plate 602.

The driver container 603 contains the driver plate 602. For example, the driver container 603 has a groove for sliding the driver plate 602. In some other embodiments, the driver plate is attached to the driver container with screws.

The driver container 603 is fixed to the fixing bracket 613.

The driver container 603 has a driver opening 633 facing to the first wall 607.

The manual switch 609 is disposed on the driver plate 602.

The manual switch 609 has a switch pin 611 to be moved for selecting a setting of the driver circuit 601.

The shielding cover 610 conceals the manual switch 609 so that users do not touch the manual switch 609 directly from outside of the lighting apparatus.

The cover plate 612 has a sliding hole 621 for the shielding cover 610 to move along the sliding hole 621. The embodiments in FIG. 1 to FIG. 7 show such design more clearly and are explained below.

The cover plate 612 is fixed on the door opening 632. Specifically, the door opening 632 allows an interaction and connection to the shielding cover 610. Users touch the shielding cover 610 instead of the manual switch 609, e.g. the switch pin 611 so as to prevent electric shock.

The light source 608 receives a driving current generated by the driver circuit 601.

In some embodiments, the driver container 603 is fixed inside a driver housing 604, the driver housing 604 is fixed to the fixing bracket 613. In other words, there are at least two layers for preventing the contact of the driver circuit 601 from outside.

In some embodiments, the lighting apparatus may also include a side cover 635.

The driver container 603 and the driver housing 604 have a side opening 636 aside the third wall 605, and the side cover 635 closes the side opening 636.

In some embodiments, the lighting apparatus may also include a wire plate 615 for attaching a power wire 614 to transmit an external power to the driver circuit 601 to generate the driving current. For example, 110V AC external power is converted by the driver circuit to generate a DC driving current.

Figure 6:
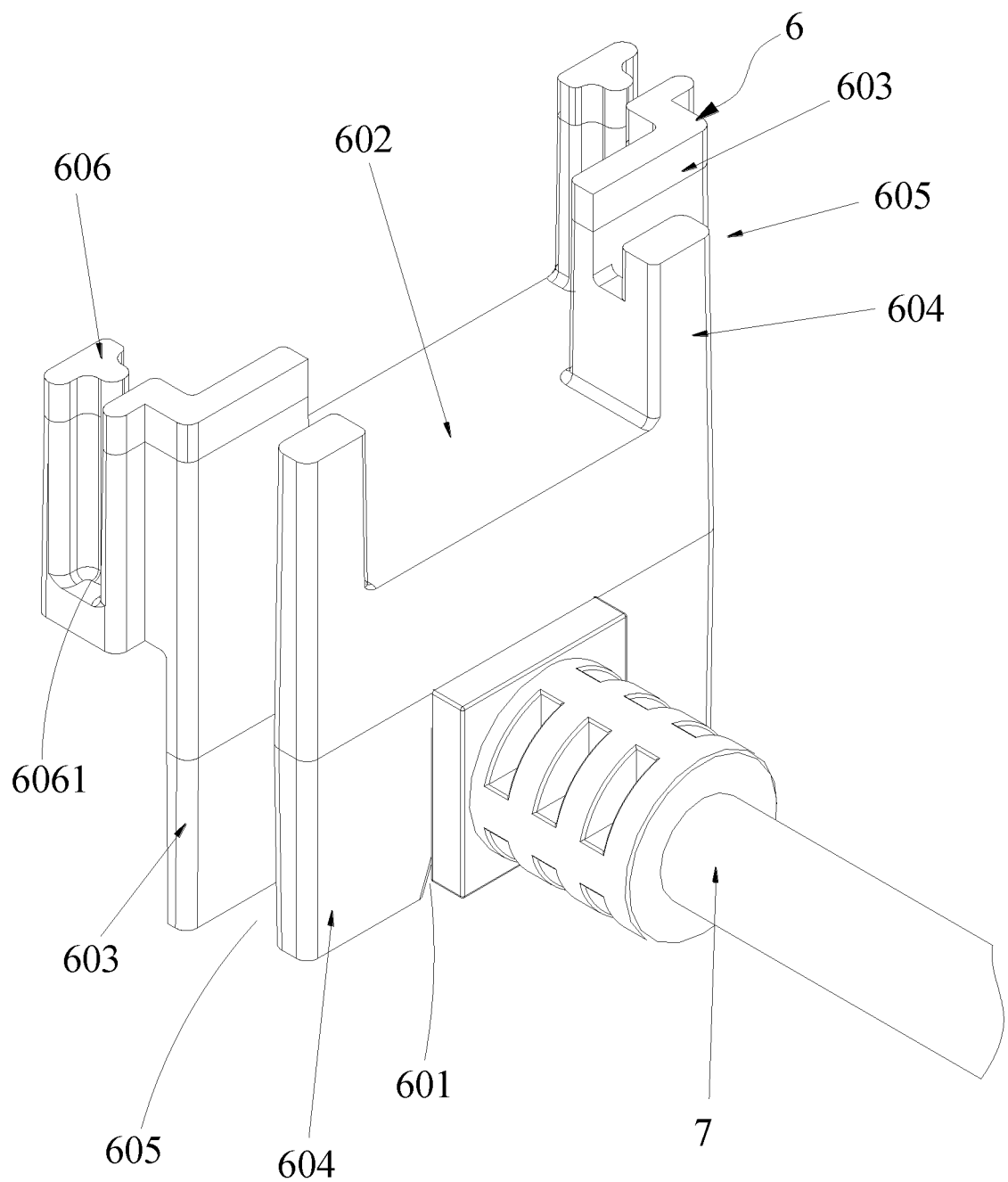
FIG. 6 illustrates a limiting plate example.

In some embodiments, the driver plate has two limiting layer for fixing the power wire to prevent undesired movement of the power wire, as shown in the example of FIG. 6.

In some embodiments, the wire plate is fixed to the door opening.

In some embodiments, the cover plate is attached on the wire plate. In such example, the wire plate has a portion for fixing the cover plate or integrated with the cover plate.

In some embodiments, a mixed signal wire is used to connecting both the manual switch and the power wire to the driver circuit. For example, a common wire is used for receiving a control signal of the manual switch and the power wire directing the signals to the driver circuit 801.

In some embodiments, the shielding cover is electric insulating.

In some embodiments, the cover plate is electric insulating.

In some embodiments, the shielding cover has an elastic surface for users to engage more comfortably. In addition, the elastic surface holds the switch pin 611 more firmly.

In some embodiments, the cover plate is replaceble to correspond a type of the setting. For example, some driver circuit may have color temperature setting, and the cover plate is marked with several labels indicating different settings while sliding the switch pin.

In some embodiments, the lighting apparatus may also include a first fixing plate 641 and a second fixing plate 642.

The first fixing plate 641 is extended and perpendicular to the first wall 607.

The second fixing plate 642 is extended and perpendicular to the third wall 605.

The first fixing plate 641 and the second fixing plate 642 are used for fixing the lighting apparatus to a platform, e.g. a ceiling or a wall.

In some embodiments, the driver plate is disposed on the driver container with a top gap 643 and a bottom gap 644 to inner surfaces of the driver container 603.

Figure 7:
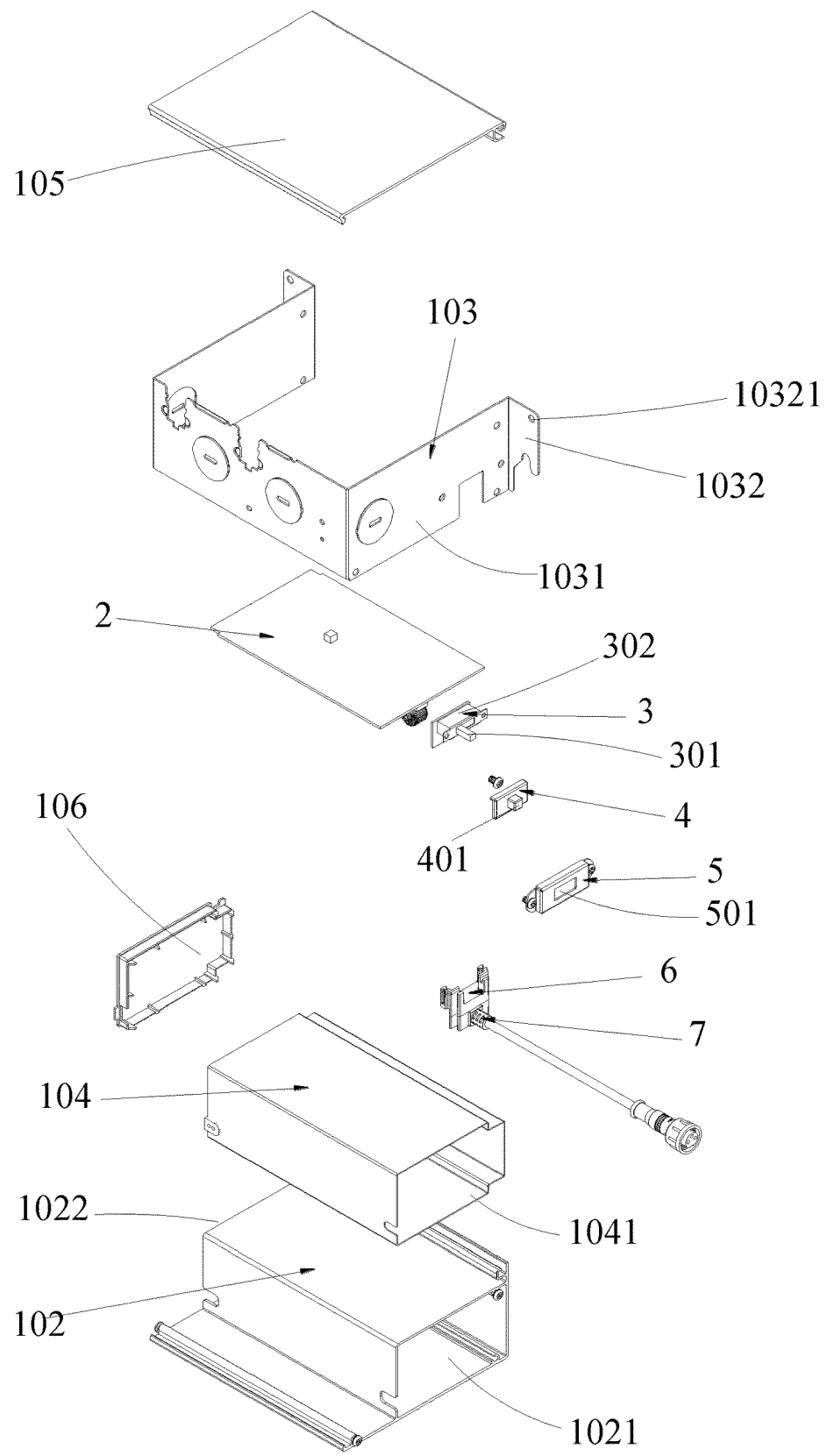
FIG. 7 illustrates an exploded view of the driver module in FIG. 1.

In some embodiments, the second wall 606 has a wire hole 609 covered with a detachable wire cover, like the two detachable round wire holes shown in FIG. 7.

In some embodiments, a fuse 635 is placed between the driver circuit 601 and and the manual switch 609 to prevent accident electric shock passing through the manual switch to hurt users.

In some embodiments, the manual switch 609 has a switch body 651 mounted on the driver plate 602.

Figure 9:
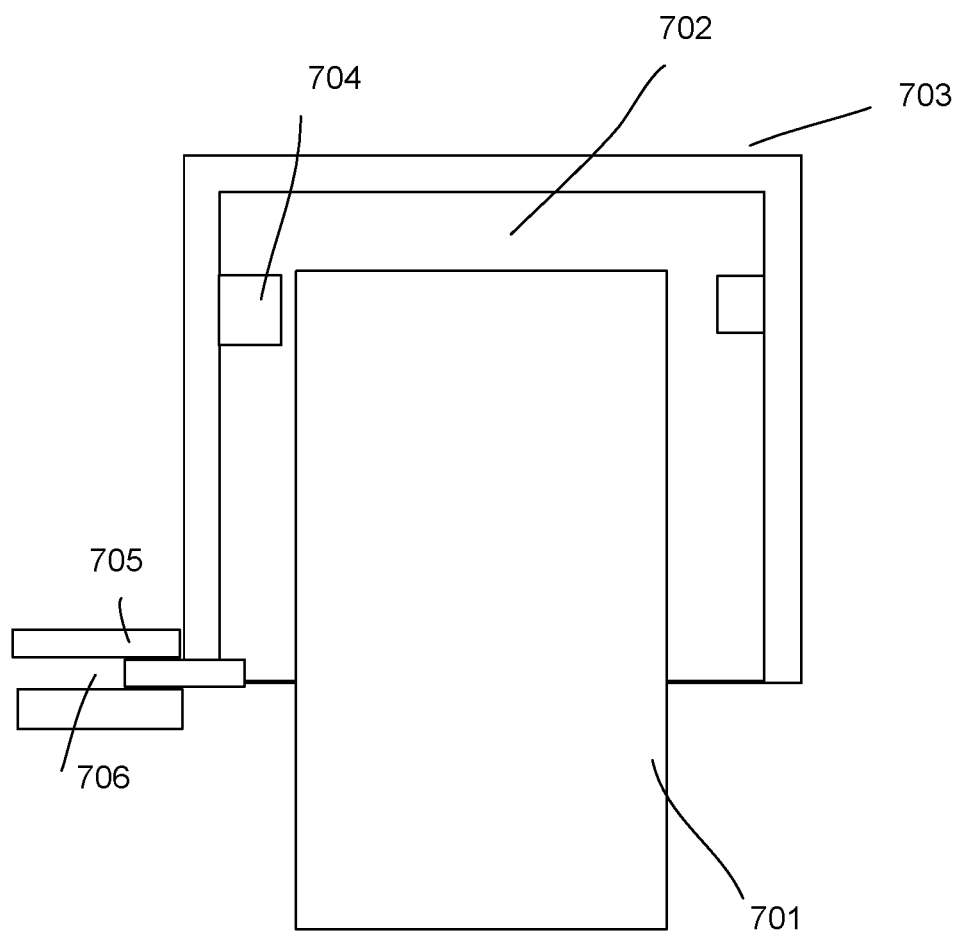
FIG. 9 shows a shielding cover example.

In FIG. 9, there is an air gap 702 between the shielding cover 703 and the switch pin 701.

In FIG. 9, a socket 704 is formed inside the shielding cover 703 for plugging the switch pin 701.

In some embodiments, the cover plate 705 has a sliding track 706 for moving the shielding cover 703.

Figure 1:
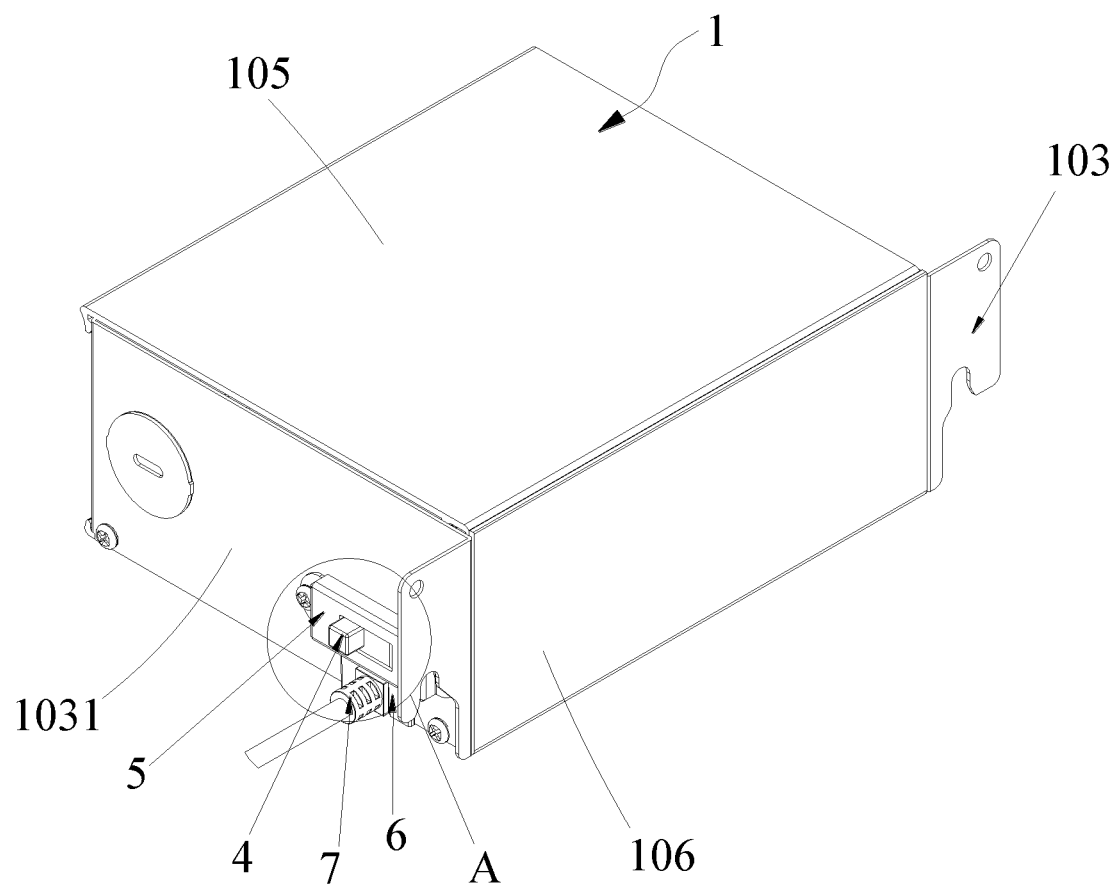
FIG. 1 illustrates a driver module example.

Please refer to FIG. 1, which shows a detailed example.

In FIG. 1, the driver module 1 of the lighting apparatus has a fixing bracket 103. The fixing bracket 103 has three walls illustrated in FIG. 7, according to the same concept mentioned above.

There is a driver housing 105 fixed to the fixing bracket 103. There is also a lateral cover 106.

The wire plate 6 is used for fixing a power wire 7. There is a shielding cover 4 placed on a cover plate 5. A first wall 1031 has a door opening for placing the cover plate 5 and the wire plate 6.

Figure 2:
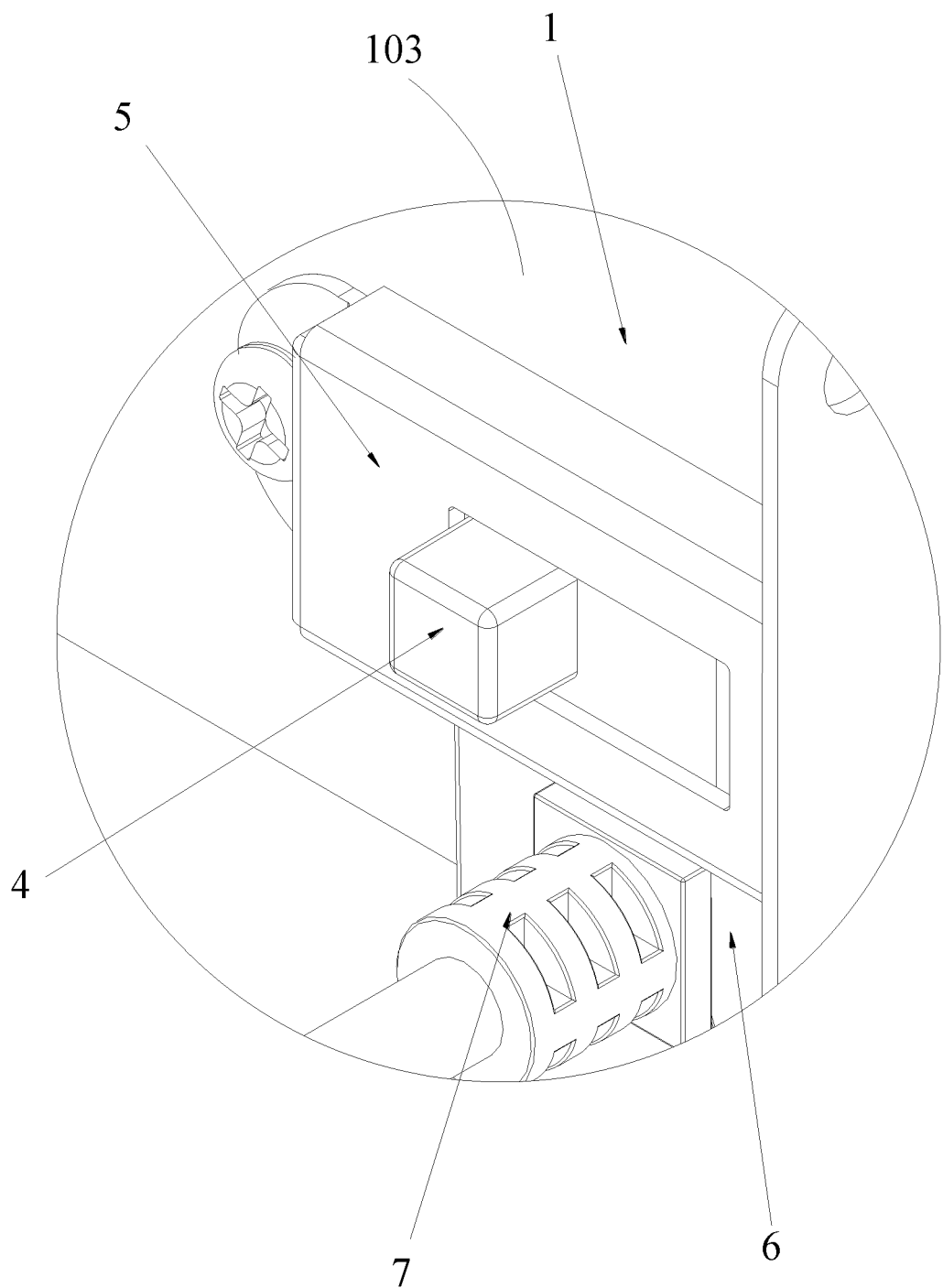
FIG. 2 illustrates a zoom-up view of a portion of the driver module.

FIG. 2 shows a zoom-up view of the example in FIG. 1.

In FIG. 2, the driver module 1 has a fixing bracket 103. The shielding cover 4 is used for cover and conceal a manual switch. The shielding cover 4 is placed on the cover plate 6 for providing a double protection. The wire plate 6 is used for fixing the power wire 7 so as to keep the power wire 7 correctly and firmly fixed to the driver module 1.

Figure 3:
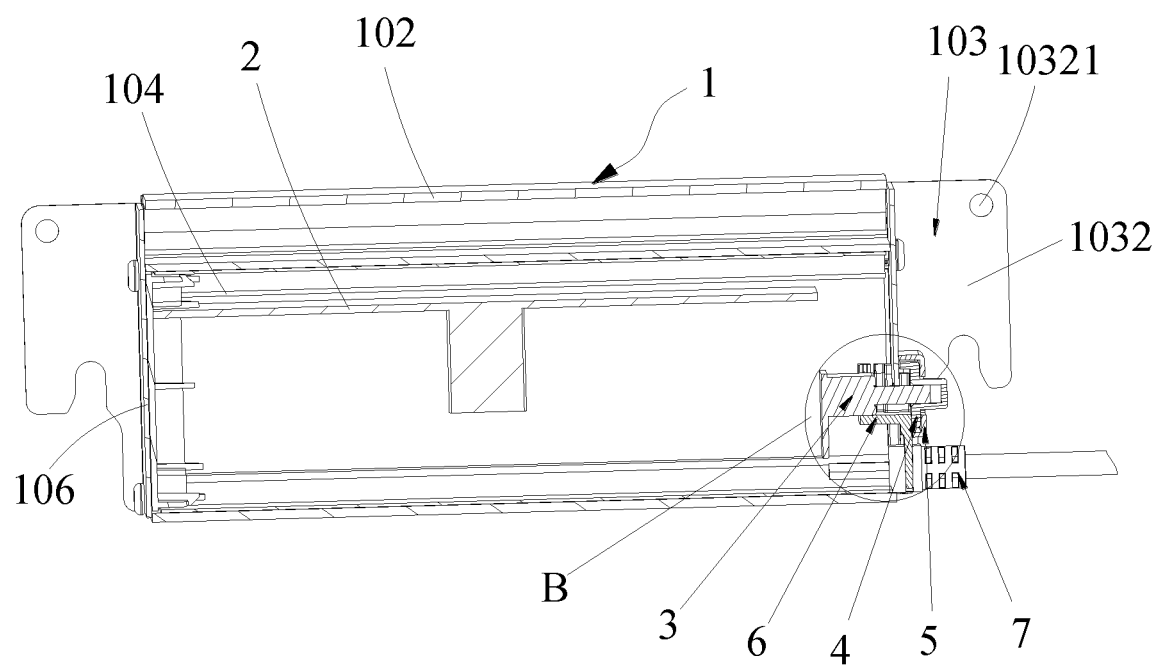
FIG. 3 illustrates a side view of the example in FIG. 1.

FIG. 3 shows a cross-sectional view of the example in FIG. 1. The same reference numerals among drawings refer to the same components and are not repeated for brevity.

In FIG. 3, the fixing bracket 103 has a fixing plate 1032. The fixing plate 1032 has a fixing hole 1032 for fixing to a platform using a screw. There is a manual switch 3 connected to the driver plate 2. The driver plate 2 is placed in a driver container 104 and the driver container is further placed in a driver housing 102 for providing a double protection.

There is a side cover 106 for concealing the components of the driver module 1.

Figure 4:
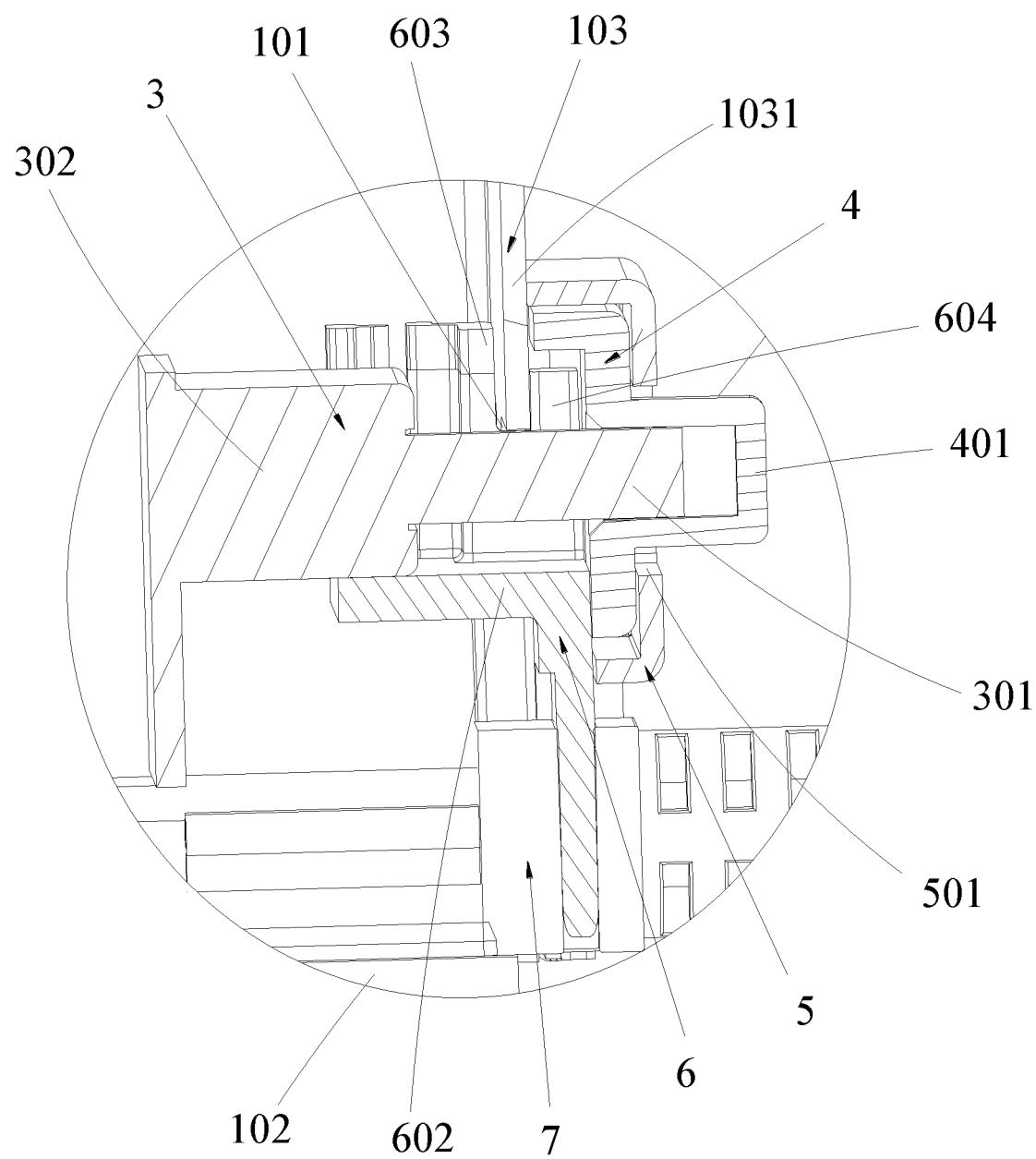
FIG. 4 illustrates a zoom-up view of cross-sectional view of a manual switch.

FIG. 4 show a zoom-up view of the example in FIG. 3.

In FIG. 4, the shielding cover has a pressing part 401 for covering and concealing a switch pin 301. There is a second limiting plate 604, a second escape hole 501 placed on the cover plate 5. There is a wire plate 6 for allowing a power wire 7 to be attached. There is a first limiting plate 603 and a first escape hole 101 for disposing the manual switch 3. The manual switch 3 has a switch body 302 to place on the driver plate 602.

Figure 5:
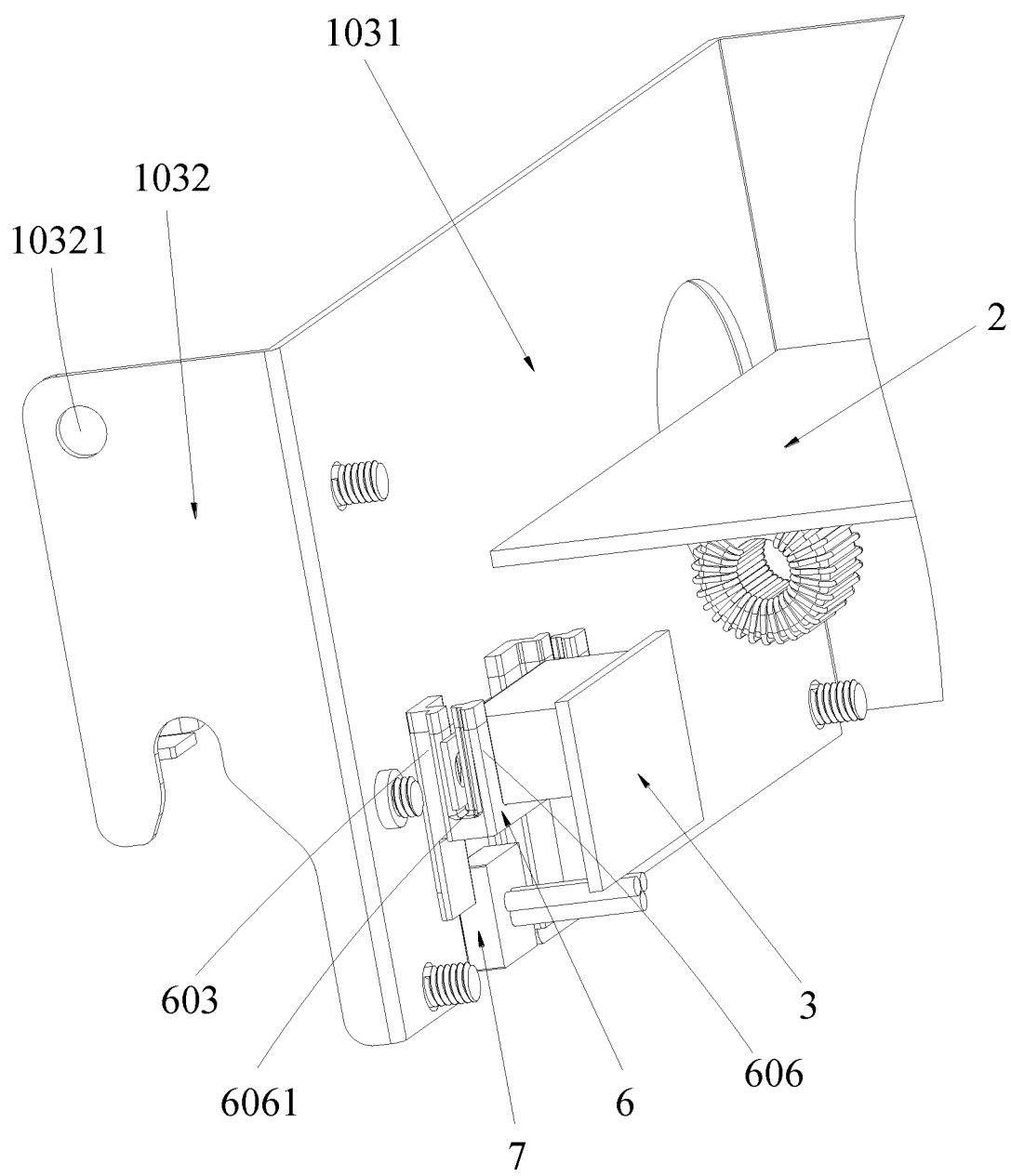
FIG. 5 illustrates a portion of components in the example of FIG. 1.

FIG. 5 shows a driver plate 2 is concealed by a plate 103 of the first wall. The manual switch 3 is placed on a holder 606 that is further fixed to the wire plate 6. There is an installation groove for installing the manual switch on the inner side of the driver module. The first limiting plate 603 is used for aligning and placing the components.

FIG. 6 shows a zoom-up view of the components mentioned above, except further illustrating an escape gap 605, which provides a better positioning function to fix the power wire 7.

FIG. 7 show an exploded view of the example and components mentioned above.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings.

The embodiments were chosen and described in order to best explain the principles of the techniques and their practical applications. Others skilled in the art are thereby enabled to best utilize the techniques and various embodiments with various modifications as are suited to the particular use contemplated.

Although the disclosure and examples have been fully described with reference to the accompanying drawings, it is to be noted that various changes and modifications will become apparent to those skilled in the art. Such changes and modifications are to be understood as being included within the scope of the disclosure and examples as defined by the claims.

The invention claimed is:

1. A lighting apparatus, comprising:
   a fixing bracket having a first wall, a second wall and a third wall, wherein the first wall and the third wall are connected on two sides of the second wall, the first wall has a door opening;
   a driver plate;
   a driver circuit mounted on the driver plate;
   a driver container for disposing the driver plate, wherein the driver container is fixed to the fixing bracket, wherein the driver container has a driver opening facing to the first wall;
   a manual switch disposed on the driver plate, wherein the manual switch has a switch pin to be moved for selecting a setting of the driver circuit;
   a shielding cover concealing the manual switch;
   a cover plate with a sliding hole for the shielding cover to move along the sliding hole, wherein the cover plate is fixed on the door opening;
   a light source for receiving a driving current generated by the driver circuit, wherein the cover plate is replaceable to correspond another type of the setting, wherein there is an air gap between the shielding cover and the switch pin; and
   a wire plate for attaching a power wire to transmit an external power to the driver circuit to generate the driving current, wherein the wire plate is fixed to the door opening, wherein the cover plate is attached on the wire plate.

2. The lighting apparatus of claim 1, wherein the driver container is fixed inside a driver housing, the driver housing is fixed to the fixing bracket.

3. The lighting apparatus of claim 2, further comprising a side cover, wherein the driver container and the driver housing have a side opening aside the third wall, and the side cover closes the side opening.

4. The lighting apparatus of claim 1, wherein the driver plate has two limiting layer for fixing the power wire to prevent undesired movement of the power wire.

5. The lighting apparatus of claim 1, wherein the shielding cover is electric insulating.

6. The lighting apparatus of claim 5, wherein the cover plate is electric insulating.

7. The lighting apparatus of claim 5, wherein the shielding cover has an elastic surface.

8. The lighting apparatus of claim 1, further comprising a first fixing plate and a second fixing plate, wherein the first fixing plate is extended and perpendicular to the first wall, the second fixing plate is extended and perpendicular to the third wall, wherein the first fixing plate and the second fixing plate are used for fixing the lighting apparatus to a platform.

9. The lighting apparatus of claim 1, wherein the driver plate is disposed on the driver container with a top gap and a bottom gap to inner surfaces of the driver container.

10. The lighting apparatus of claim 1, wherein the second wall has a wire hole covered with a detachable wire cover.

11. The lighting apparatus of claim 1, wherein the manual switch has a switch body mounted on the driver plate.

12. The lighting apparatus of claim 1, wherein a socket is formed inside the shielding cover for plugging the switch pin.

13. The lighting apparatus of claim 1, wherein the cover plate has a sliding track for moving the shielding cover.

* * * * *